(12) United States Patent
Chou et al.

(10) Patent No.: US 11,935,722 B2
(45) Date of Patent: Mar. 19, 2024

(54) MACHINE LEARNING ON WAFER DEFECT REVIEW

(71) Applicant: Taiwan Semiconductor Manufacturing Co., Ltd., Hsinchu (TW)

(72) Inventors: Chung-Pin Chou, Hsinchu (TW); Sheng-Wen Huang, Hsinchu (TW); Jun-Xiu Liu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 42 days.

(21) Appl. No.: 17/870,654

(22) Filed: Jul. 21, 2022

(65) Prior Publication Data
US 2022/0359154 A1    Nov. 10, 2022

Related U.S. Application Data

(63) Continuation of application No. 17/069,712, filed on Oct. 13, 2020, now Pat. No. 11,424,101, which is a continuation of application No. 16/430,323, filed on Jun. 3, 2019, now Pat. No. 10,825,650.

(60) Provisional application No. 62/738,500, filed on Sep. 28, 2018.

(51) Int. Cl.
*H01J 37/28*    (2006.01)
*G06N 20/00*    (2019.01)
*H01J 37/153*    (2006.01)
*H01J 37/22*    (2006.01)
*H01J 37/26*    (2006.01)

(52) U.S. Cl.
CPC .............. *H01J 37/28* (2013.01); *G06N 20/00* (2019.01); *H01J 37/153* (2013.01); *H01J 37/22* (2013.01); *H01J 37/261* (2013.01)

(58) Field of Classification Search
CPC .......... H01J 37/28; H01J 37/153; H01J 37/22; H01J 37/261; G06N 20/00
See application file for complete search history.

(56) References Cited

U.S. PATENT DOCUMENTS 10,825,650 B2    11/2020    Chou et al.
2014/0341462 A1    11/2014    Sezginer et al.

*Primary Examiner* — Nicole M Ippolito
*Assistant Examiner* — Hanway Chang
(74) *Attorney, Agent, or Firm* — Seed IP Law Group LLP

(57) ABSTRACT

This disclosure is directed to solutions of detecting and classifying wafer defects using machine learning techniques. The solutions take only one coarse resolution digital microscope image of a target wafer, and use machine learning techniques to process the coarse SEM image to review and classify a defect on the target wafer. Because only one coarse SEM image of the wafer is needed, the defect review and classification throughput and efficiency are improved. Further, the techniques are not distractive and may be integrated with other defect detecting and classification techniques.

20 Claims, 5 Drawing Sheets

MACHINE LEARNING ON WAFER DEFECT REVIEW

BACKGROUND

With the evolving of semiconductor technologies, semiconductor dies are becoming increasingly smaller, while increasingly more functions and features are integrated into a single semiconductor die. Those features are tightly arranged with minimized spacing therebetween. Due to the increased feature density, more processing steps are conducted to manufacture a semiconductor die. For example, more complicated exposure, development and etching steps are conducted over a substrate. After each step, the wafer is inspected for defects like metrology offsets, shape deformation, contamination or other defects. When the inspection identifies a wafer as defective, the wafer will be further reviewed through a defect review process, for example, an automatic defect review ("ADR") process, and/or a defect classification process, e.g., an automatic defect classification ("ADC").

BRIEF DESCRIPTION OF THE DRAWINGS

Aspects of the present disclosure are best understood from the following detailed description when read with the accompanying figures. In the drawings, identical reference numbers identify similar elements or acts unless the context indicates otherwise. The sizes and relative positions of elements in the drawings are not necessarily drawn to scale. In fact, the dimensions of the various features may be arbitrarily increased or reduced for clarity of discussion.

DETAILED DESCRIPTION

Figure 1:
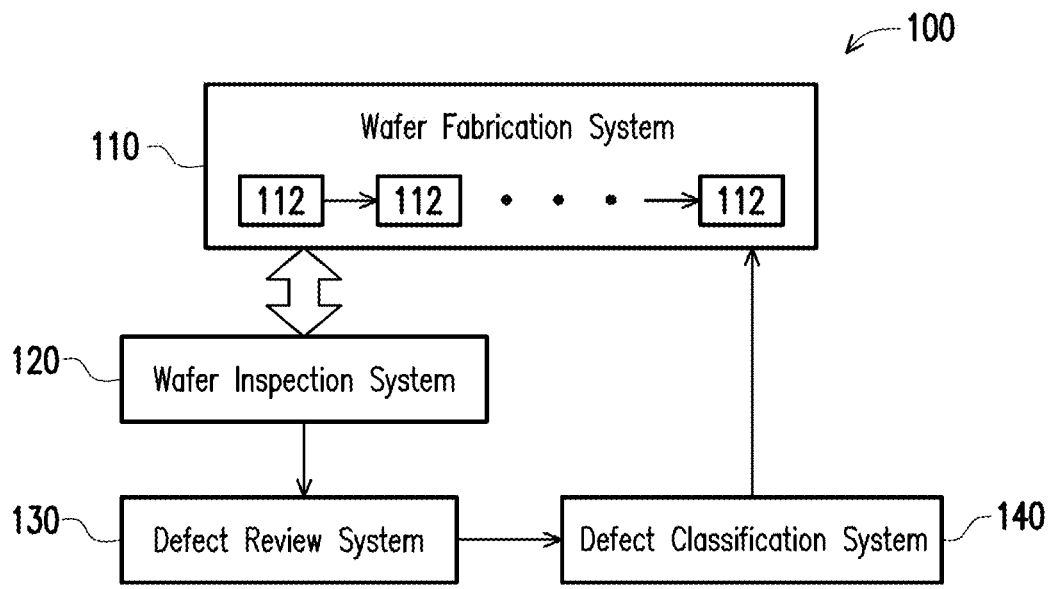
FIG. 1 is an example wafer defect management system.

This disclosure is directed to solutions of detecting and classifying wafer defects using machine learning techniques. The solutions take only one coarse resolution digital microscope image of a target wafer, e.g., a scanning electron microscope ("SEM") image, and use machine learning techniques to process the coarse SEM image to review and classify a defect on the target wafer. Because only one coarse SEM image of the wafer is needed, the defect review and classification throughput and efficiency are improved. Further, the techniques are not distractive and may be integrated with other defect detecting and classification techniques.

Traditionally, at least two SEM images, a coarse SEM image and a fine SEM image are taken on a wafer to identify a defect or to classify the defect, respectively. The disclosed techniques in various embodiments take only one coarse SEM image and analyzes the coarse SEM image to both identify and classify a defect of the wafer. Specifically, a wafer, referred to as a "target wafer", is initially inspected by a broad range wafer inspection system, e.g., a laser scanning patterned wafer defect inspection system, to determine whether a defect exist on the target wafer. When the target wafer is determined as defective, a defect region on the wafer is identified as potentially containing the defect. A digital microscope image of the defect region is obtained in a coarse resolution, which is referred to as a "coarse image" or a "first SEM image". In the disclosure herein, the term "SEM image" is used as an example to refer to the microscope image for descriptive purposes. In an embodiment, the first SEM image is obtained with a relatively coarser resolution that is sufficient to identify a defect but is generally not sufficient to classify the identified defect or to identify further details of the defect for defect analysis purposes. The coarse SEM image may have a similar resolution as the coarse SEM image used in the traditional approach to identify a defect. It is appreciated that whether a resolution of a SEM image is coarse or fine is a relative definition and is determined based on a specific technology node, or a specific type of ICs formed on the wafer. For example, a first SEM image of a coarser image resolution may be acceptable for an analog or mixed signal IC, but may not be acceptable for a digital IC because the digital IC includes smaller structural dimensions than the analog or mixed signal IC.

In an embodiment, the first SEM image is compared with a reference image to determine a defect(s) or defect area within the defect region. The reference image may be obtained by a (first) machine learning process through simulations. The simulation may be based on one or more of the wafer design data, the fabrication recipes or the fabrication process parameters of the target wafer. For example, a first machine learning unit may use simulation and/or other techniques to translate the wafer design data into a reference image of a wafer surface in the form of a coarse SEM image. For example, machine learning techniques are used to simulate the influence of the fabrication processes on the geometries of the features on a wafer. That is, the feature geometries provided by the wafer design data are adjusted by the simulated fabrication process influence to generate the reference image of the wafer. The reference image thus reflects the impact of the fabrication process on the shapes of the structures on the wafer and in some embodiments resembles a SEM image of an actual wafer made in the respective fabrication processes. Further, training or learning processes are used to improve the simulation results and/or the simulation processes, e.g., simulation algorithms. For example, the simulated SEM image of a wafer may be compared with an actual SEM image, e.g., a "good" or non-defective portion of the first SEM image or a SEM image of another wafer of a same design as the target wafer. The comparison results may be used to update the simulation result and/or to update the simulation algorithms. Alternatively or additionally, the reference image may be a SEM image of a reference wafer that is comparable to the target wafer, e.g., a "good" wafer of the same wafer design.

The first SEM image of the target wafer is compared with the reference image to locate a defect area or a defect feature within the defect region. Generally, the defect area or a defect feature is smaller than and contained within the defect region. In the description herein, a defect feature or defect area is referred to as a region of interest ("ROI") for descriptive purposes. To further review the defect, e.g., to classify the defect and/or to diagnose a cause of the defect, a ROI image of a higher image resolution is used, referred to as a "fine ROI image" for descriptive purposes.

The disclosed technique does not take another SEM picture of the ROI. Instead, the fine ROI image, i.e., with higher resolution image than the coarse SEM image, is obtained through a second machine learning process. A coarse SEM image of the ROI, also referred to as a "second coarse image", is obtained from the first SEM image of the defect region through digital image processing techniques, e.g., through cropping the first SEM image to extract the ROI portion thereof. As such, the second coarse image is an extracted portion of the first coarse image. By extracting the second image from the first SEM image, the image resolution will not improve and will either remain the same or get coarser. Therefore, the second SEM image is a coarse image. The second machine learning unit maps the second coarse image of the ROI with a database of image feature details that have a higher resolution. Each piece of image feature detail is saved as a small piece of image of finer resolution which can be used to substitute a part of the second coarse image. As such, each piece of the image feature detail is referred to as an "image patch" for descriptive purposes. An image patch has higher image resolution and includes more details than the part of the second coarse image. Specifically, if a match is achieved between a part of the second coarse image and an image patch, the image patch is used to substitute for the part of the second coarse image. When all the parts of the second coarse image are replaced by the image patches, an image of finer resolution is, thus, generated. In an embodiment, the mapping may be conducted based on identification features included on the second coarse image, referred to as a "feature identifier." For example, the second SEM coarse image is partitioned into partition parts and the feature identifiers are identified with each of the partition parts. The feature identifiers are used to map with image patches in the database. The mapped image patches are used to compliment or substitute for the respective partition part. When all the partition parts are replaced with the image patches, a fine image of the ROI is obtained. In an embodiment, the partition of the second coarse image and the mapping of the partition parts with the image patches may be conducted multiple times to generate a fine image of the ROI. That is, the second coarse image may be partitioned differently to generate different partition parts to map with the saved image patches. In an embodiment, the mapped image patches may be used to refine the partitioning of the second coarse image. For example, if two image patches for two adjacent partition parts on the second coarse image are not consistent with one another, e.g., features details of the two image patches do not match, the second coarse image of the ROI may be re-partitioned to generate different partition parts to avoid the matching problem.

In an embodiment, rules are applied in selecting or filtering the image patches to generate the list of image patches to be used for generating the fine ROI image. For example, the rules may provide that surface features corresponding to a immediately adjacent partition portion of the second coarse image of the ROI be consistent with one another. The rules may also provide that the surface features of the fine images be consistent with the design data of the target wafer.

In an embodiment, the feature map of the second machine learning unit may include multiple tiers of image patches corresponding to different levels or tiers of partition parts. For example, the feature identifier obtained from the second coarse image of ROI may be mapped into the first tier of image patches of the feature map. The first tier of image patches may have a first scale of image resolution which is finer than the second coarse image. The mapped first tier of image patches may be further partitioned to obtain a second tier of feature identifiers. The second tier of features identifiers may be mapped with a second tier of image patches that have a second scale of image resolution, which is finer than the first scale of image resolution. In one or more of the mappings, rules may be applied to restrict the mapping. For example, the rules may provide that in each tier of features identifiers, the proposed feature details of adjacent partition parts must be consistent with one another. The rules may also provide that the in each tier of mapping, the mapped feature details be consistent with the design data of the target wafer.

An image patch may be selected from a database of already existing image patches. An image patch may also be generated based on the nearby feature details. Further, the selection or generation of the image patch for a specific partition part may be trained together with the selection or generation of image patches of partition portions adjacent to the specific partition portion. Various training approaches may be used and within the scope of the disclosure. The disclosure is not limited by any specific training approaches in the selection or generation of image patches.

After the image patches are selected for a tier or scale of image resolution, they are combined to generate a fine resolution image having image resolution at the scale or tier for the ROI. The fine resolution image of the ROI is used to classify the defect on the target wafer to determine one or more of a type of the defect or a cause of the defect or other detailed analysis of the defect. The fine image of the ROI may be further partitioned into partition parts, which may be mapped with image patches of a finer image resolution.

The feature map of the second machine learning unit may be updated with new data on the fine resolution SEM images available to the second machine learning unit. For example, after a fine resolution image of an ROI is generated by the machine learning process, an actual fine resolution image of the ROI may be captured. The actual fine resolution image may be portioned into image patches, which may be linked to the feature identifiers of the second coarse image. Further, the actual fine resolution SEM image may be compared to the generated fine resolution image of the same ROI to determine whether the generated fine resolution image matches the actual fine resolution SEM image. The comparison results may be used to calibrate or train the machine learning algorithm in the partitioning the coarse images or in mapping the partition parts with the image patches. For example, an image patch selected by the second machine learning unit may be compared with the respective partition portion on the actual fine resolution image to determine whether the selected image patch meets the actual fine resolution image. If the selected image patch does not meet the actual fine resolution image, one or more of the image patch selection/generation algorithm or the stored image patches may be updated so that the correct image patch can be selected/generated.

FIG. 1 is an example wafer defect management system 100. As shown in FIG. 1, the system 100 includes a wafer fabrication on-site system 110, a broad range wafer inspection system 120, a defect review system 130, and a defect classification system 140. The wafer fabrication on-site system 110 is configured to process a wafer to form integrated circuits thereon. The wafer fabrication on-site system 110 includes multiple stages 112 that process a wafer in a sequential manner. In a typical semiconductor manufacturing process, a wafer (a whole wafer of a diameter of 8 inch, 12 inch, 16 inch or other diameter sizes) is prepared. Circuitry is formed on the wafer. The circuitry formation generally includes front-end-of-line ("FEOL"), middle-of-line, ("MOL"), and back-end-of-line ("BEOL"). The FEOL processes include wafer preparation, isolation, well formation, gate patterning, spacer, extension and source/drain implantation, silicide formation, and dual stress liner formation. The MOL processes includes gate contact and/or source/drain contact formation. The BEOL processes include all wafer fabrication processes subsequent to the MOL or FEOL, for example, forming the wirings in metallization layers to interconnect the individual devices. The metallization layers are separated by dielectric layers, namely, the inter-layer dielectric ("ILD") layers. The ILD layers are either silicon oxide or low-k dielectric materials. After the circuitry formation processes, the whole wafer with the circuitry formed thereon is sawn into smaller dice. The dice are then tested and packaged to obtain individual integrated circuit product. The wafer fabrication on-site system 110 includes any toolsets used for any processes of processing the wafer, either as a whole wafer or a sawn wafer, e.g., a die.

The wafer inspection system 120 may be an integrated part of the wafer fabrication on-site system 110 or may be configured to function together with the wafer fabrication on-site system 110 as a standalone device. The wafer inspection system 120 may include one or more laser-based inspection devices, ultrasonic inspection devices, transducers, electron beam based inspection devices, bright-field inspection devices, dark-field inspection devices, other metrology devices, and/or other devices suitable for wafer defect inspections. For example, the wafer inspection system 120 may include one or more of beam guns, photomultiplier tubes, E-beam tilts, silicon drift detectors, optical microscopes, microscope beam controllers, attenuation and scan amplifiers, or internal transfer units. The wafer inspection system 120 may be configured to inspect wafers in various stages 112 of fabrication, e.g., patterned wafers, whole wafers, sawn wafers, JEDEC trays, multi-chip modules, or other stages of wafer processing. The wafer inspection system 120 may use a same or a different inspection device for inspecting a wafer at different stages 112 of the wafer fabrication system 110.

The wafer inspection system 120 is configured to inspect a wafer for a defect at any stage of the semiconductor manufacturing process. The defect may include any defects, e.g., metallization defect, diffusion defect, passivation layer defect, scribing defect, glassivation defect, or interconnect defects. The defects may also include a dimension variation or deviation according to wafer fabrication process control. The defects may be systematic defects or random defects. A defect may be visible on a surface of a wafer or may not be visible. For example, a patterned wafer inspection device detects a defect by comparing the pattern images of adjacent die areas, which are to be sawn into individual dies, and obtaining the differences between adjacent die areas with respect to the pattern images.

If the wafer inspection system 120 determines that a wafer includes a defect, the wafer is presented to the defect review system 130 as a target wafer for further analysis. On the target wafer, a region covering and/or surrounding the probable defect is identified as a defect region. The wafer inspection system 120 normally is a sub-micron level inspection in the range of about 0.1 micron to about 1 micron. The identified defect region generally has a diameter in the range of about 1 micron to about 10 micron or other diameter sizes.

The defect review system 130 may include an imaging device such as a scanning electron microscope ("SEM") and one or more machine learning units, which are described in further details herein. The defect review system 130 is configured to identify a defect or a defect area, referred to as a region of interest ("ROI"), from the defect region of the target wafer that is identified as defective by the wafer inspection system 120. The defect review system 130 is also configured to obtain a coarse image of the target wafer, referred to as a "first SEM image," to generate a coarse image of the ROI, referred to as a "second coarse image," or to generate a fine image of the ROI. The fine image of the ROI is sent to the defect classification system 140 for further analysis.

The defect classification system 140 is configured to determine one or more of a type, a size, a circuitry location, a function element, or other characteristics of a defect or a cause of the defect at least partially based on the outputs of the defect review system 130, e.g., the fine image of the ROI.

Figure 2:
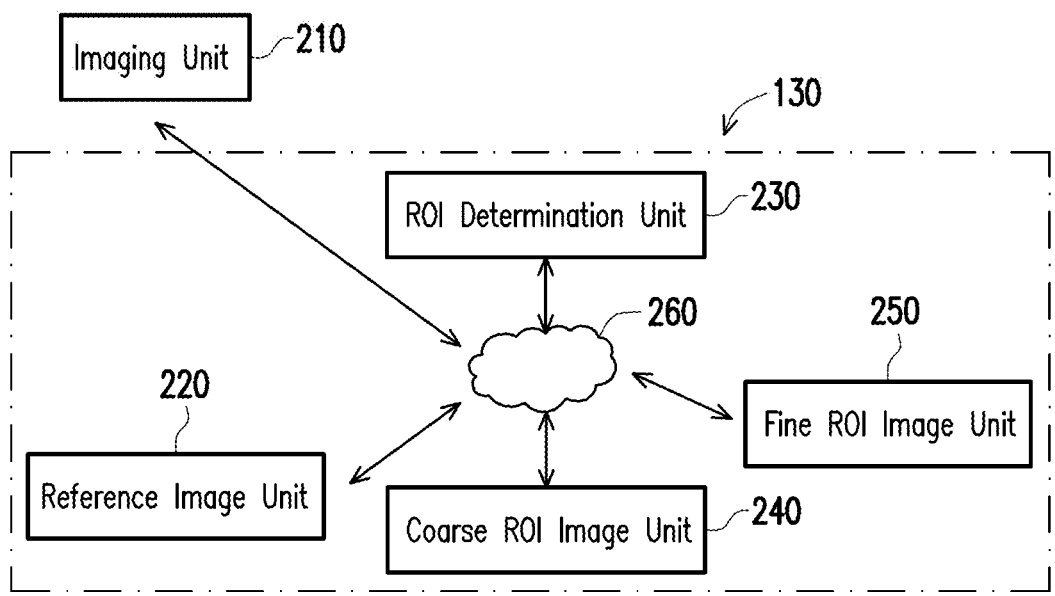
FIG. 2 is an example wafer defect review system.

FIG. 2 is an example defect review system 130. Referring to FIG. 2, the defect review system 130 includes one or more imaging unit 210, a reference image unit 220, a ROI determination unit 230, a coarse ROI image unit 240, and a fine ROI image unit 250. One or more of the reference image unit 220, the ROI determination unit 230, the coarse ROI image unit 240, or the fine ROI image unit 250 may be implemented through a computing device, e.g., a sever computer. The elements of the defect review system 130 may reside in a same computing device, e.g., a server computer, or reside in separate computing devices that are coupled to one another via data communications over a network 260 in a distributed computing environment, e.g., a cloud-based computing environment. In various embodiments, one or more of the components of the defect review system 130 may reside on a same physical computing device and communicate with other components through network communications. For example, the ROI determination unit 230 and the coarse ROI image unit 240 may reside on a same computing device. Other variants on the physical arrangements/configurations of the system 130 components are also possible, which are all within the scope of the disclosure.

In operation, the imaging unit 210 is configured to obtain a first image of a target wafer. For example, the first image of the target wafer is a SEM image. The first SEM image of the target wafer is one of a two-dimensional image of a surface of the target wafer or a three-dimensional image illustrating the surface of the target wafer and the depth/height of the features on the surface. In an embodiment, the first SEM image may cover a whole surface of the target wafer. In another embodiment, the first SEM image covers a portion, referred to as "first portion," of a surface of the target wafer. The first portion encloses the defect region identified by the wafer inspection system 120. The first SEM image has a first resolution that is relatively coarse with respect to one or more of an image resolution requirement of the defect classification system 140 or a finer resolution image of a ROI as described herein. It should be appreciated that the "coarse" resolution of the first SEM image is defined purely relative to the finer resolution as described with respect to the fine ROI image and the term "coarse" resolution does not convey any absolute standard or criteria regarding the resolution of the first SEM image. In an embodiment, the coarse first SEM image has a resolution in a range of about 1.4 nm to about 0.1 micron.

Figure 3A:
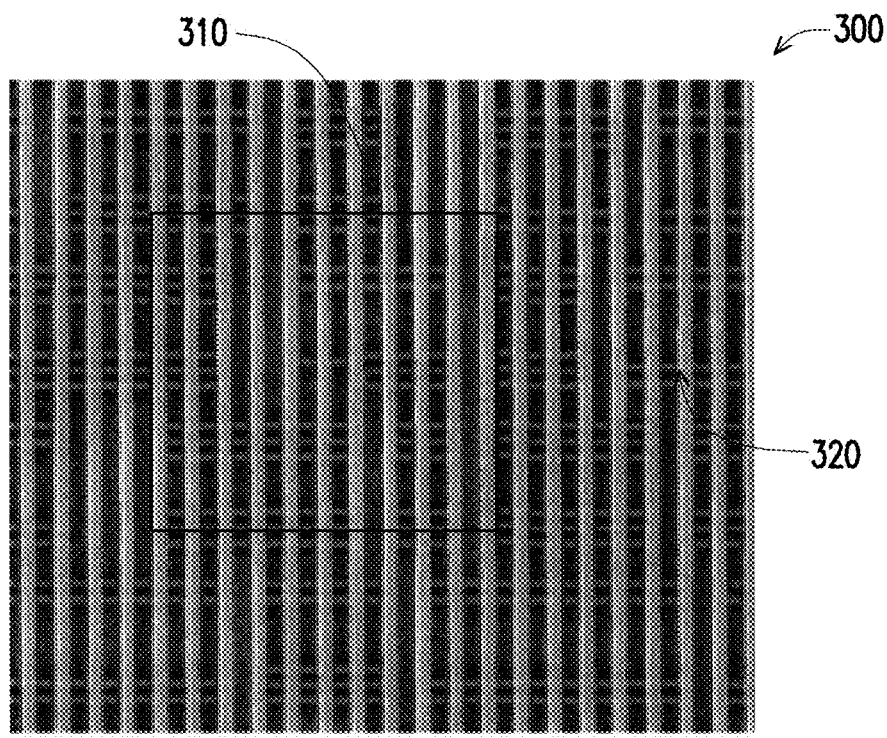
FIG. 3A is an example SEM image of a target wafer.

FIG. 3A is an example first coarse SEM image of a first portion 300 of an example target wafer. The first portion includes a defect region 310 and a non-defect part 320. An example image resolution of the FIG. 3A image is about 2.5 nm/pixel.

In an embodiment, the first coarse SEM image is stored in an inspected image database coupled to the imaging unit 210. The inspected image database also stores other inspected images of other wafers in various image resolutions.

The reference image unit 220 is configured to generate a reference image corresponding to the first portion 300 of the target wafer. In an embodiment, the reference image unit 220 includes a machine learning unit, referred to as a "first machine learning unit," that generates the reference image based on one or more of the design data, the fabrication recipes, the fabrication process data or the first SEM image of the first portion 300. The design data indicate details of the circuitry built over the wafer or the substrate. The fabrication recipes indicate the details about how each layer of the circuitry structure are formed in the fabrication process. The fabrication process data indicate the actual fabrication process parameters or variants in implementing the fabrication recipes, e.g., the specific parameters of the tool sets (age, brand, tuning, etc.), the tool or wafer position metrologies, and the light source variations. For example, in the critical photolithograph process, a stepper tool (e.g., a step and repeat camera) and a wafer stage align with one another in making the exposures on the wafer. A stepper passes light through a reticle, forming an image of the reticle pattern. The image is focused and reduced by a lens, and projected onto the surface of a wafer that is coated with a photoresist. A stepper works in a step-and-repeat manner where the pattern on the reticle is exposed repeatedly across the surface of the wafer in a grid. The stepper moves a wafer through the wafer stage as a step from one shot location to another. The step movement of the wafer may be conducted back and forth, e.g., left and right, with the grid under the lens of the stepper. The relative position offset and/or rotation offset between the stepper and the wafer stage will affect the dimensions of the respective features formed on the wafer. Such fabrication process information may be obtained and used by the first machine learning unit in generating the reference image.

In an embodiment, the first machine learning unit uses simulation to generate the reference image. The simulation considers the impacts of various fabrication processes on the shape or profile of a feature formed on the wafer. For example, a selective wet etching process may form a structure feature with rounded edge and undercut portions. Such side-effects caused by a specific process in the recipes are factored into the generation of the reference image.

The first machine learning unit may retrieve information from one or more of an inspected image database or a graphic database system ("GDS") database. The inspected image database includes information of actual wafer images. The GDS database includes design data regarding circuitry features and/or layout. The actual wafer image and the GDS design data may be used to learn or train the generation of the reference image. For example, a reference image may be initially generated through simulation using the GDS data. The simulation process simulates the impacts of the actual fabrication process in forming the structure features over the substrate using the GDS data. The initially generated reference image may then be compared with an actual wafer image. The comparison results may be used to validate or refine the simulation process of generating the reference image using the GDS data. Note that the reference image is for a wafer of the same design data as the target wafer.

In an embodiment, the first SEM image, stored in the inspected image database, is also used in learning the reference image. In some embodiments, the first SEM image covers the first portion 300 of the target wafer, which encloses and is larger than the defect region 310. As such, the non-defect part 320 of the first SEM image may be used to train the simulation of the reference image. For example, a corresponding part on the simulated reference image may be compared to a non-defect part 320 of the first SEM image to train the simulated image of the corresponding part.

Figure 3B:
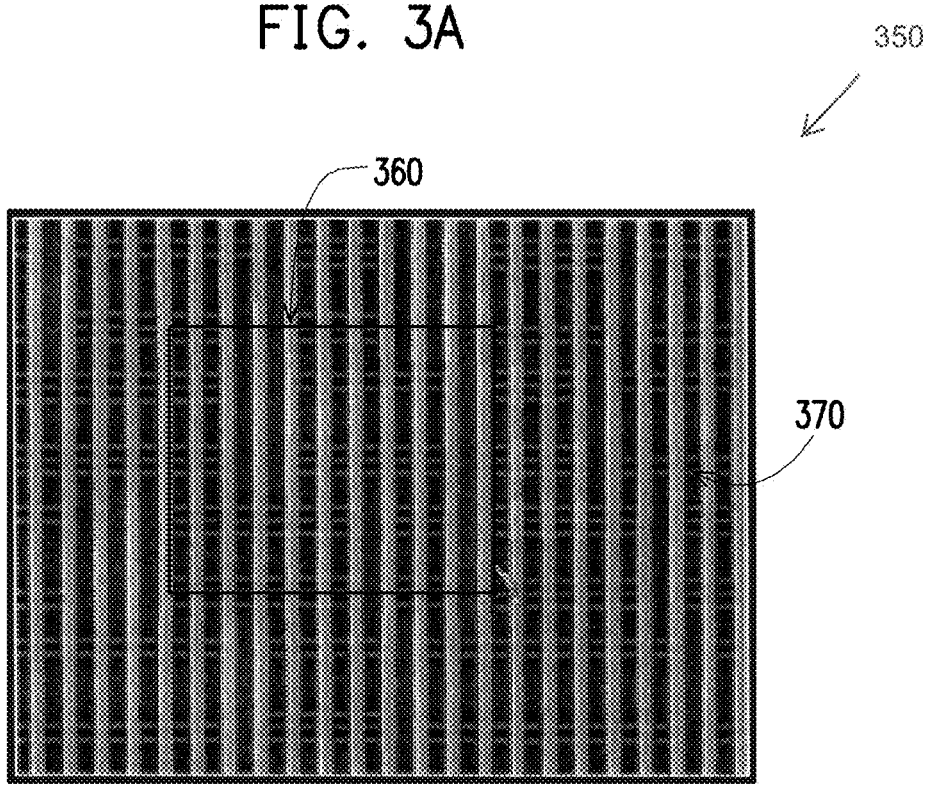
FIG. 3B is an example reference image for the target wafer of FIG. 3A.

The reference image may be partitioned into a plurality of segments referred to as "learning parts." The feature details of the learning parts are obtained and updated through a recursive learning process. Further, the feature details of adjacent learning parts are learned in a mutually reinforced way. For example, a rule may apply which provides that adjacent learning parts on the simulated reference image be consistent with one another. As such, a validated learning part may be used to train an adjacent learning part because the adjacent learning part must be consistent with the validated learning part. FIG. 3B is an example reference image 350 generated by the reference image unit 220. Reference image 350 corresponds to the first portion 300, portion 360 of the reference image 350 corresponds to the defect region 310, and portion 370 of the reference image 350 corresponds to the non-defect region 320 of the first SEM image of FIG. 3A. In an embodiment, the reference image 350 has substantially a same image resolution as the first SEM image of the first portion 300 of the target wafer.

FIGS. 3A and 3B both show an example portion of a wafer, which is non-limiting. It should be appreciated that the first SEM image and the reference image both may cover a whole wafer.

The ROI determination unit 230 is configured to compare the first SEM image with the reference image 350 to determine a defect or a defect area. When a defect or a defect area is determined, a refined defect region is identified on the first SEM image, referred to as a region of interest ("ROI"). The ROI covers a region on the first SEM image that does not match the corresponding area on the reference image. Any criteria may be used to determine whether a region on the first SEM image matches the reference image, which are all within the scope of the disclosure. The ROI may be the same as the defect region or may be different than the defect region that is identified by the wafer inspection system 120. In the description herein, it is assumed, for illustrative purposes, that the ROI overlaps with the defect region 310 on the first SEM image. As such, the defect region 310 is also referred to as a ROI 310.

The coarse ROI image unit 240 is configured to generate a coarse image of the ROI based on the first SEM image. In an embodiment, the coarse ROI image unit 240 crops the first SEM image to extract the ROI region and enlarges the extracted ROI region to obtain the coarse image on the ROI. That is, the resolution of the coarse ROI image cannot be finer than the first SEM image. Due to the cropping operation of the first SEM image, the coarse ROI image may further lose some details and have a resolution lower/coarser than the first SEM image. The coarse ROI image is also referred to as a "second coarse image" for descriptive purposes, although the second coarse image is not captured by a SEM imaging unit. Additional or alternative to cropping, the coarse ROI image unit 240 may use other image processing techniques to generate a coarse ROI image based on the first SEM image of the first portion 300 of the target wafer, which are all within the scope of the disclosure. However, the coarse ROI image unit 240 may not be configured to add any details to the coarse ROI image that is not already contained in the first SEM image.

Figure 4A:
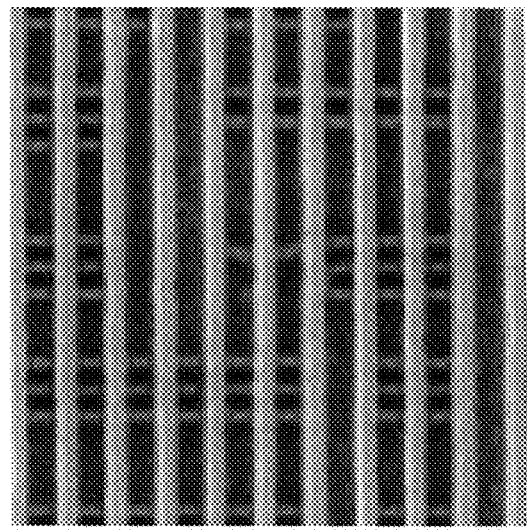
FIG. 4A is an example coarse ROI image.

FIG. 4A shows an example coarse ROI image 400, which is generated from the first SEM image of the first portion 300 of the target wafer. More specifically, the coarse ROI image 400 is substantially the ROI 310 cropped from the first SEM image of the first portion 300 of the target wafer.

The fine ROI image unit 250 is configured to generate a finer resolution image of the ROI 310 based on the coarse image 400 of the ROI 310. In an embodiment, the fine ROI image unit 250 includes a second machine learning unit. In an embodiment, the second machine learning unit is a convolutional neural network ("CNN") which recursively learns fine feature details of region-based feature identifiers at multiple scales in a mutually reinforced manner. Each scale represents a level of image resolution. The learning at each scale includes mapping between feature identifiers and proposed feature attentions, e.g., detailed image part. The mappings are learned recursively based on one or more of the inter-scale mutual dependency and intra-scale mutual dependency. For example, in the inter-scale mutual dependency learning, the feature details proposed or mapped in a previous scale may be used as a reference for the generation the feature details of a later scale, i.e., with finer image resolution. The feature details proposed or mapped in the later scale may also be referenced back to further learn or refine the proposed feature details of the previous scale. For example, the feature details proposed in the previous scale are combined to generate a previous scale fine image. The previous scale fine image is further partitioned into later scale partition parts, which are used to map with later scale feature details. The feature details mapped in the later scale may contradict with the rules which may indicate that the respective one of the feature details proposed in the previous scale are not correct. The feature details of the previous scale may be then be updated. Under the intra-scale mutual dependency, the proposed feature details for adjacent partition parts at the same scale should be consistent with one another and are recursively used as references for one another.

Specifically, for example, the second machine learning unit starts from the second coarse image for the first scale learning. The second coarse image is partitioned into partition parts of this first scale and for each first scale partition part, one or more first scale feature identifiers are identified. The identifying the feature identifiers and the partitioning of the second coarse image may be conducted in a mutually reinforced manner in that the partitioning may also be learned and updated with the feature identifiers used as references. For example, if a feature identifier extends across and are included in two adjacent partition parts, the two partition parts may be combined, e.g., re-partitioned, into one partition part, so that the feature identifier can be used to map with the corresponding features details. The identified feature identifiers are mapped into feature details, which provide finer attentions on the corresponding partition part than the second coarse image. The feature identifiers and feature details may not have one-to-one correspondence. Mutual intra-scale dependency is applied, among others, in selecting a feature detail to map with a feature identifier. In the intra-scale dependency, feature details of adjacent partition parts are used as references such that the proposed feature detail of a partition part is consistent with those of the adjacent partition parts. Other factors, e.g., design rules, fabrication recipes, circuitry types, may also be considered as rules in the mapping between the feature identifier and the feature details. In some embodiments, a learning history, e.g., successful mappings between the feature identifiers of the second coarse image and the feature details of the database of image feature details, e.g., image patch, are also considered. For example, if a feature identifier corresponds to multiple feature details or multiple image patches, and historically the feature identifier has been mapped with one of the image patches more than other image patches, the image patch will be treated with a priority in future mapping operations involving the feature identifier.

In an embodiment, rules are applied in structuring the mapping between the feature identifiers and the feature details. The rules may include the intra-dependency rule, the inter-dependency rule as described herein or other rules. Those rules may be stored in a rule set, which relates the rules with one or more of the feature identifiers, the partition parts or the image patches/feature details.

The feature identifiers obtained from the coarse SEM image of the ROI and the mapped feature details corresponding to the feature identifiers are part of the first scale of the recursive learning. The first scale recursive learning generates a first scale fine image.

With the first scale fine image, the second machine learning unit of the fine ROI image unit 250 proceeds to a second scale learning based on the first scale fine image and in some instances the second coarse image of the ROI. Specifically, the first scale fine image is further partitioned into partition parts (referred to as "second scale partition parts") that are used for mapping with second scale feature details. Second scale feature identifiers are identified from the second scale partition parts and are mapped with second scale feature details to generate a second scale fine image, in a manner similar to the generation of the first scale fine image. The second scale fine image has a finer image resolution than the first scale fine image. The rule set of the second scale learning may be similar to or may be different than that of the first scale learning of the feature details of the ROI.

In addition, the inter-scale mutual dependency, as part of the second scale learning rule set, may provide that the second scale feature details proposed in the second scale learning be used recursively as references to the proposed feature details of the first scale learning. For example, the intra-scale mutual dependency on the second scale learning may provide a second scale feature detail for a second scale partition part, which does not correspond to any second scale feature identifiers of the second scale partition part. Note that the second scale feature identifiers are obtained from the second scale partition parts and the second scale partition parts are obtained through partitioning the first scale fine image that includes the first scale feature details. As such, the second scale feature identifiers are linked to the first scale feature details. On the other hand, the proposed second scale feature details may also be used to refine the first scale learning. For example, the feature details proposed in the second scale learning may conflict with the rules which may indicate that the first scale fine image can be improved or updated or that the first scale machine learning can be updated. The updating of the first scale machine learning may also lead to the updating of the partition of the second coarse SEM image of the ROI and, thus, the feature identifiers thereof. The updated first scale machine learning will generate an updated first scale fine image of the ROI, which in turn is used for the second scale learning. Such recursive applications of inter-scale mutual dependency and intra-scale mutual dependency rules make the learning of the features details on each scale more accurate.

After the second scale fine image is generated, the second machine learning unit may proceed to a third scale learning. The third scale learning may be implemented in a similar manner as the second scale learning based on the second scale fine image and in some instances one or more of the first scale fine image or the coarse SEM image of the ROI.

The number of scales of learning may be customized by the second machine learning unit for an individual type of wafer. Further, the rule sets may also be customized for an individual type of wafer. For example, the rule sets may be customized to disable inter-scale mutual dependency in the learnings. The rule sets may also be customized to restrict the application of the inter-scale dependency. For example, a customized rule set may provide that for each learning scale, the inter-scale mutual dependency only applies to one scale backward and/or one scale forward. Other variants are also possible and within the scope of the disclosure.

The first machine learning unit and the second machine learning unit may each be a convolutional neural network or a super-resolution convolutional neural network ("SRCNN"). The mapping between the feature identifiers and the feature details may be implemented as linear mapping or non-linear mapping. For example, a linear regression equation/algorithm or a non-linear regression equation/algorithm may be used to correlate a feature identifier to feature details or to an image patch. The finally proposed feature details, e.g., image patches, are aggregated based on the respective partition parts to reconstruct the fine resolution ROI image.

Figure 4B:
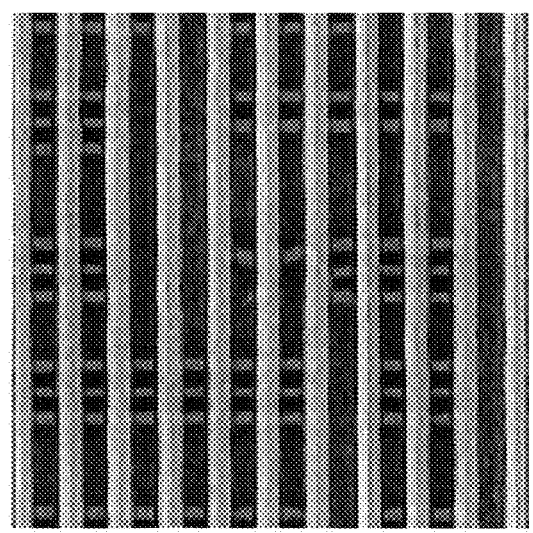
FIG. 4B is an example fine ROI image generated based on the example coarse ROI image of FIG. 4A.

FIG. 4B shows an example fine ROI image 450 generated based on the coarse ROI image 400 of FIG. 4A. The fine ROI image 450 has an image resolution about 1.1 nm/pixel.

Referring back to FIG. 1, the defect classification system 140 is configured to assign the defect of the ROI into respective class based on the fine resolution ROI image generated by the second machine learning unit. The defect classification system 140 applies classification rules, which are stored in a rule engine database, to the fine resolution image of the ROI or any part thereof. For example, the defect classification system 140 may apply suitable automatic defect classification ("ADC") algorithms to the fine resolution image of the ROI. The ADC algorithms uses single-class or multi-class classifiers that have classification rules indicating regions within the ROI. The disclosure is applicable to any and all kinds of ADC algorithms and/or other defect classification approaches, which are all within the scope of the disclosure. In the disclosed techniques, the fine resolution image of the ROI is generated through the machine learning and is used by the ADC to classify the defects identified on the ROI. Because the disclosed technique eliminates the need to capture a fine resolution SEM image of the ROI, the throughput of the wafer inspection and validation process can be substantially improved.

Figure 5:
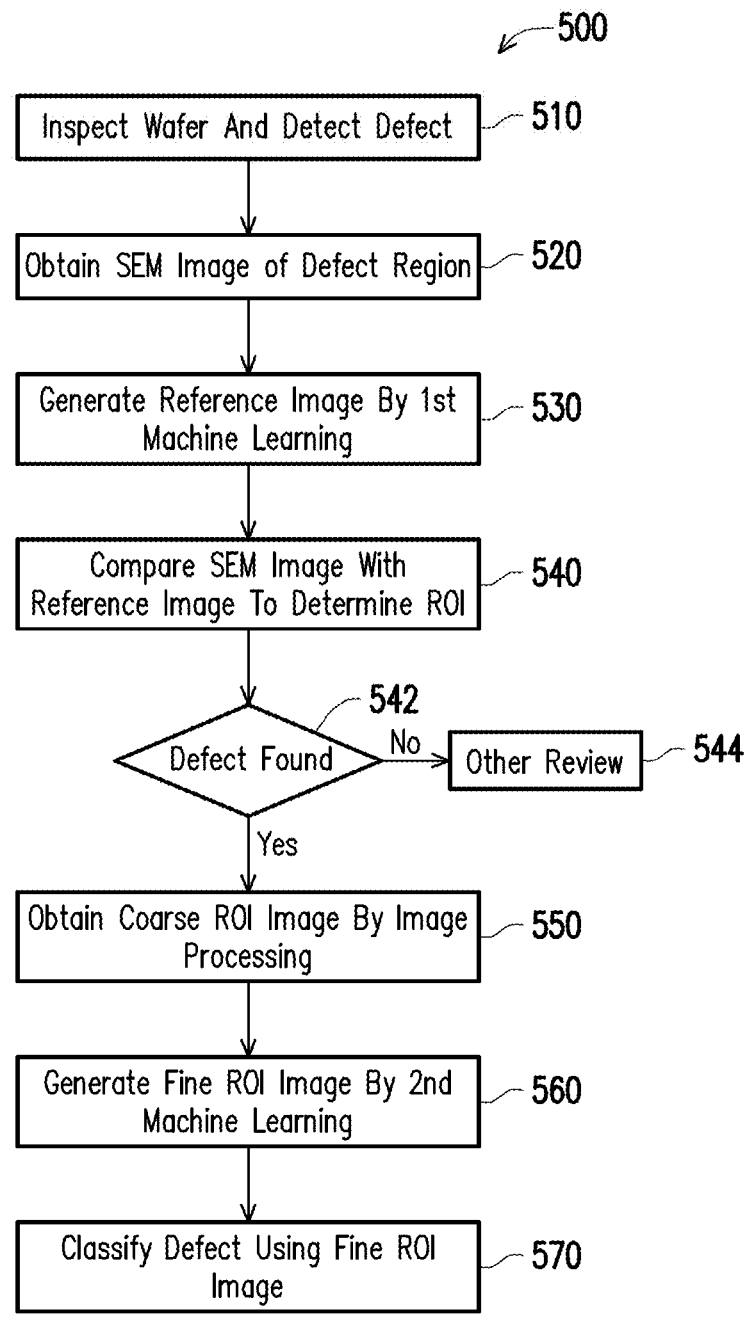
FIG. 5 is an example operation of the wafer defect management system of FIG. 1.

FIG. 5 is a flow diagram of an example operation 500 of the wafer defect management system 100. Referring to FIG. 5, at example operation 510, the wafer inspection system 120 inspects a wafer and detects a defect. The wafer inspection system 120 may include one or more wafer inspection devices and may conduct one or more of electron inspection, X-ray inspection or an optical inspection of the wafer. The wafer identified as having a defect is referred to as a target wafer. In some instances, the wafer inspection system 120 also identifies the defect region on the target wafer, within which a defect is located. The defect region may be the whole target wafer surface or a part of the target wafer surface. The defect region may be identified as a two-dimensional or three-dimensional region.

At example operation 520, the image unit 210 of the defect review system 130 obtains a coarse resolution image of the target wafer or the defect region of the wafer. In an example, the imaging system 120 takes a SEM image of the target wafer or specifically the defect region on the target wafer, e.g., the SEM image of FIG. 3A.

At example operation 530, the reference image generation unit 220 generates a reference image, e.g., the reference image 350 of FIG. 3B, corresponding to the defect region 300 of the target wafer (FIG. 3A). Specifically, the reference image 350 represents what the defect region should look like on a "good" wafer. The reference image 350 is generated using machine learning based on one or more of the circuitry design, the fabrication recipes or a "good" part 320 of the coarse image 300 (FIG. 3A).

In example operation 540, the ROI determination unit 230 compares the coarse image of the defect region with the reference image to determine a region of interest ("ROI"). The ROI contains a "defect," e.g., an identified difference between the coarse image of the target wafer and the reference image. The ROI may or may not overlap with the defect region identified by the wafer inspection system 120.

In example operation 550, the coarse ROI image unit 240 obtains a coarse image of the ROI from the coarse image of the defect region. In an embodiment, the coarse ROI image unit 240 crops the first SEM image to obtain the coarse image of the ROI. The coarse image of the ROI has a resolution no finer than the first SEM image.

In example operation 560, the fine ROI image unit 250 generates a fine resolution image of the ROI based on the coarse image of the ROI. In an embodiment, a super-definition convolutional neural network system is used to learn the image details from the coarse ROI image. Multi-scale recursive learnings are conducted to learn feature identifiers and corresponding feature details on each scale of image resolution. Feature identifiers link feature details between learning scales. Such linking is learned recursively with intra-scale mutual dependency and inter-scale mutual dependency rules being applied and other rules being applied. For example, within a same scale, feature details of adjacent partition parts need to be consistent with one another and need to comply with the circuitry design data and/or the fabrication recipes.

In example operation 570, the defect classification system 140 assigns a classification to the defect of the target wafer based on the generated fine resolution image of the ROI.

In an embodiment, a judgment block 542 is added subsequent to example operation 540. If the example operation 540 fails to identify an ROI, e.g., the coarse SEM image of the defect region is sufficiently similar to the reference image, example operation 544 transfers the target wafer to a supplemental defect review path. For example, in the supplemental defect review path, the coarse image of the defect region is compared with a corresponding coarse image of a "good" wafer to determine a ROI.

Figure 6:
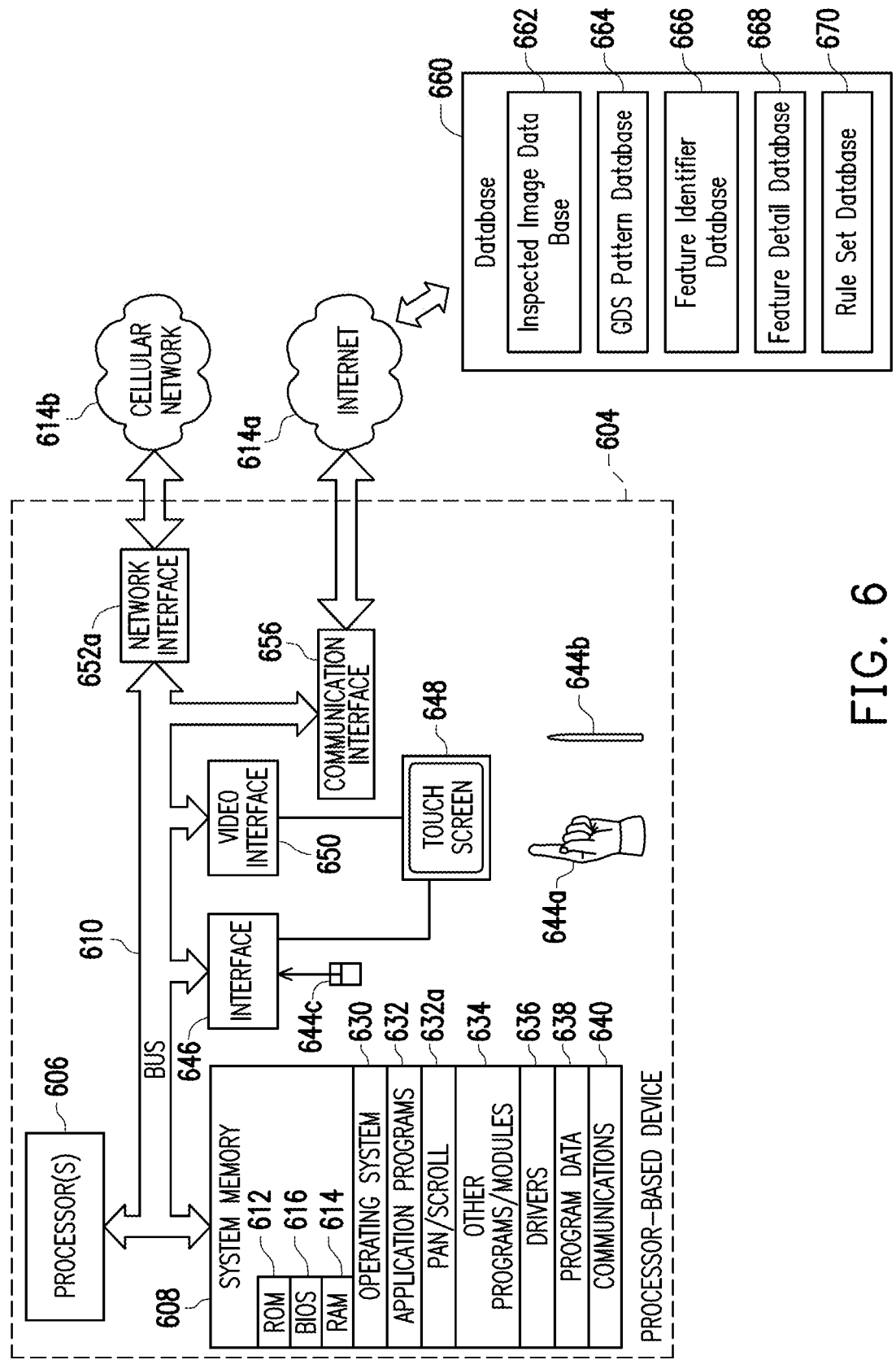
FIG. 6 is an example computing device implementing the wafer defect review system of FIG. 2.

FIG. 6 shows a processor-based device 604 suitable for implementing various embodiments described herein. For example, the processor-based device 604 may be representative of the computing systems of the reference image unit 220, the ROI determination unit 230, the coarse ROI image unit 240 or the fine ROI image unit 250 of FIG. 2. Although not required, some portion of the embodiments will be described in the general context of processor-executable instructions or logic, such as program application modules, objects, or macros being executed by one or more processors. Those skilled in the relevant art will appreciate that the described embodiments, as well as other embodiments, can be practiced with various processor-based system configurations, including handheld devices, such as smartphones and tablet computers, wearable devices, multiprocessor systems, microprocessor-based or programmable consumer electronics, personal computers ("PCs"), network PCs, minicomputers, mainframe computers, and the like.

The processor-based device 604 may, for example, take the form of a smartphone or tablet computer, which includes one or more processors 606, a system memory 608 and a system bus 610 that couples various system components including the system memory 608 to the processor(s) 606. The processor-based device 604 will at times be referred to in the singular herein, but this is not intended to limit the embodiments to a single system, since in certain embodiments, there will be more than one system or other networked computing device involved. Non-limiting examples of commercially available systems include, but are not limited to, ARM processors from a variety of manufactures, Core microprocessors from Intel Corporation, U.S.A., PowerPC microprocessor from IBM, Sparc microprocessors from Sun Microsystems, Inc., PA-RISC series microprocessors from Hewlett-Packard Company, 68xxx series microprocessors from Motorola Corporation.

The processor(s) 606 may be any logic processing unit, such as one or more central processing units (CPUs), microprocessors, digital signal processors (DSPs), application-specific integrated circuits (ASICs), field programmable gate arrays (FPGAs), etc. Unless described otherwise, the construction and operation of the various blocks shown in FIG. 6 are of conventional design. As a result, such blocks need not be described in further detail herein, as they will be understood by those skilled in the relevant art.

The system bus 610 can employ any known bus structures or architectures, including a memory bus with memory controller, a peripheral bus, and a local bus. The system memory 608 includes read-only memory ("ROM") 612 and random access memory ("RAM") 614. A basic input/output system ("BIOS") 616, which can form part of the ROM 612, contains basic routines that help transfer information between elements within processor-based device 604, such as during start-up. Some embodiments may employ separate buses for data, instructions and power.

The processor-based device 604 may also include one or more solid state memories, for instance Flash memory or solid state drive (SSD) 618, which provides nonvolatile storage of computer-readable instructions, data structures, program modules and other data for the processor-based device 604. Although not depicted, the processor-based device 604 can employ other nontransitory computer- or processor-readable media, for example a hard disk drive, an optical disk drive, or memory card media drive.

One or more of the various memory units 608, 612, 614, 618 may contain executable instructions dedicated or designated to implement one or more of the reference image unit 220, the ROI determination unit 230, the coarse ROI image unit 240 or the fine ROI image unit 250. For example, when executed by the processor 606, the executable instructions dedicated or designated for the reference image unit 220 may implement the first machine learning unit/process as described herein to generate a reference image based on circuitry design data of a target wafer. When executed by the processor 606, the executable instructions dedicated or designated for the fine ROI image unit 250 may implement the second machine learning unit/process as described herein to generate a fine resolution ROI image based on the coarse ROI image, as described herein.

Program modules can be stored in the system memory 608, such as an operating system 630, one or more application programs 632, other programs or modules 634, drivers 636 and program data 638.

The application programs 632 may, for example, include panning/scrolling 632a. Such panning/scrolling logic may include, but is not limited to logic that determines when and/or where a pointer (e.g., finger, stylus, cursor) enters a user interface element that includes a region having a central portion and at least one margin. Such panning/scrolling logic may include, but is not limited to logic that determines a direction and a rate at which at least one element of the user interface element should appear to move, and causes updating of a display to cause the at least one element to appear to move in the determined direction at the determined rate. The panning/scrolling logic 632a may, for example, be stored as one or more executable instructions. The panning/scrolling logic 632a may include processor and/or machine executable logic or instructions to generate user interface objects using data that characterizes movement of a pointer, for example data from a touch-sensitive display or from a computer mouse or trackball, or other user interface device.

The system memory 608 may also include communications programs 640, for example a server and/or a Web client or browser for permitting the processor-based device 604 to access and exchange data with other systems such as user computing systems, Web sites on the Internet, corporate intranets, or other networks as described below. The communications program 640 in the depicted embodiment is markup language based, such as Hypertext Markup Language (HTML), Extensible Markup Language (XML) or Wireless Markup Language (WML), and operates with markup languages that use syntactically delimited characters added to the data of a document to represent the structure of the document. A number of servers and/or Web clients or browsers are commercially available such as those from Mozilla Corporation of California and Microsoft of Washington.

While shown in FIG. 6 as being stored in the system memory 608, the operating system 630, application programs 632, other programs/modules 634, drivers 636, program data 638 and server and/or browser 640 can be stored on any other of a large variety of nontransitory processor-readable media (e.g., hard disk drive, optical disk drive, SSD and/or flash memory).

A user can enter commands and information via a pointer, for example through input devices such as a touch screen 648 via a finger 644a, stylus 644b, or via a computer mouse or trackball 644c which controls a cursor. Other input devices can include a microphone, joystick, game pad, tablet, scanner, biometric scanning device, etc. These and other input devices (i.e., "I/O devices") are connected to the processor(s) 606 through an interface 646 such as a touch-screen controller and/or a universal serial bus ("USB") interface that couples user input to the system bus 610, although other interfaces such as a parallel port, a game port or a wireless interface or a serial port may be used. The touch screen 648 can be coupled to the system bus 610 via a video interface 650, such as a video adapter to receive image data or image information for display via the touch screen 648. Although not shown, the processor-based device 604 can include other output devices, such as speakers, vibrator, haptic actuator or haptic engine, etc.

The processor-based device 604 operates in a networked environment using one or more of the logical connections to communicate with one or more remote computers, servers and/or devices via one or more communications channels, for example, one or more networks 614a, 614b. These logical connections may facilitate any known method of permitting computers to communicate, such as through one or more LANs and/or WANs, such as the Internet, and/or cellular communications networks. Such networking environments are well known in wired and wireless enterprise-wide computer networks, intranets, extranets, the Internet, and other types of communication networks including telecommunications networks, cellular networks, paging networks, and other mobile networks.

When used in a networking environment, the processor-based device 604 may include one or more network, wired or wireless communications interfaces 652a, 656 (e.g., network interface controllers, cellular radios, WI-FI radios, Bluetooth radios) for establishing communications over the network, for instance the Internet 614a or cellular network.

In a networked environment, program modules, application programs, or data, or portions thereof, can be stored in a server computing system (not shown). Those skilled in the relevant art will recognize that the network connections shown in FIG. 6 are only some examples of ways of establishing communications between computers, and other connections may be used, including wirelessly.

For convenience, the processor(s) 606, system memory 608, and network and communications interfaces 652a, 656 are illustrated as communicably coupled to each other via the system bus 610, thereby providing connectivity between the above-described components. In alternative embodiments of the processor-based device 604, the above-described components may be communicably coupled in a different manner than illustrated in FIG. 6. For example, one or more of the above-described components may be directly coupled to other components, or may be coupled to each other, via intermediary components (not shown). In some embodiments, system bus 610 is omitted and the components are coupled directly to each other using suitable connections.

The processor-based device 604 may include or function with a database device 660. The database device 660 may include an inspected image database 662 that stores actual microscope images of wafers, a GDS pattern database 664 that stores GDS patterns, a feature identifier database 666 that stores feature identifiers for various scales of learning, a feature details database 668 that stores feature details for various scales of learning, or a rule set database 670 that stores rule set for various scales of the learning and for different circuitry designs.

The foregoing detailed description has set forth various implementations of the devices and/or processes via the use of block diagrams, schematics, and examples. Insofar as such block diagrams, schematics, and examples contain one or more functions and/or operations, it will be understood by those skilled in the art that each function and/or operation within such block diagrams, flowcharts, or examples can be implemented, individually and/or collectively, by a wide range of hardware, software, firmware, or virtually any combination thereof. In one implementation, the present subject matter may be implemented via Application Specific Integrated Circuits (ASICs). However, those skilled in the art will recognize that the implementations disclosed herein, in whole or in part, can be equivalently implemented in standard integrated circuits, as one or more computer programs running on one or more computers (e.g., as one or more programs running on one or more computer systems), as one or more programs running on one or more controllers (e.g., microcontrollers) as one or more programs running on one or more processors (e.g., microprocessors), as firmware, or as virtually any combination thereof, and that designing the circuitry and/or writing the code for the software and or firmware would be well within the skill of one of ordinary skill in the art in light of this disclosure.

Those of skill in the art will recognize that many of the methods or algorithms set out herein may employ additional acts, may omit some acts, and/or may execute acts in a different order than specified.

In addition, those skilled in the art will appreciate that the mechanisms taught herein are capable of being distributed as a program product in a variety of forms, and that an illustrative implementation applies equally, regardless of the particular type of signal bearing media used to actually carry out the distribution. Examples of signal bearing media include, but are not limited to, the following: recordable type media such as floppy disks, hard disk drives, CD ROMs, digital tape, and computer memory.

The various implementations described above can be combined to provide further implementations.

These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure. FIG. 6 shows an example computing device 600. The computing device 600 includes a processor 606, a storage an embodiment, a computing device The present disclosure may be further appreciated with the description of the following embodiments:

In one embodiment, the one or more layers are configured for generating at least one additional reference image of the specimen based on wafer design information. For example, the models described herein may be configured to generate a reference image defining the defect of interests that uses Deep Learning architecture to train the image database of both inspected images and design layouts.

In another embodiment, the one or more layers are configured for generating at least one additional high resolution image of the specimen based on the inspected (low resolution) image database. For example, the models described herein may be configured to generate a high resolution image from low resolution images that uses Deep Learning architecture to train the image database of the inspected (low resolution) images.

In a further embodiment, the model described herein is based on Deep Learning architecture. For the example, the model may be a convolutional neural network (CNN) that can take advantage of Deep Learning concepts to solve the intractable representation problems. The model may have any CNN configuration known in the art. For the example, the model may be a super resolution CNN (SRCNN) that can take advantage of Deep Learning concepts to convert a low resolution image into a high resolution image. The model may have any SRCNN configuration known in the art.

The disclosure herein provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description herein may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the description herein, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The invention claimed is:

1. A method, comprising:
    obtaining a first microscope image of an object, the first microscope image having a first resolution;
    identifying a target region on the object;
    obtaining a second image of the target region from the first microscope image, the second image having a second resolution that is coarser than the first resolution; and
    generating a third image of the target region based on the second image of the target region through a deep learning process, the third image having a third resolution that is finer than the second resolution.

2. The method of claim 1, wherein the object is a wafer, and wherein the identifying the target region includes:
    obtaining a reference image of the wafer based on wafer design information of the wafer;
    comparing the first microscope image with the reference image to determine a mismatch between the first microscope image and the reference image on a part of the wafer; and
    identifying the part of the wafer as the target region.

3. The method of claim 2, wherein the obtaining the reference image includes simulating a side effect of a fabrication process on a shape of a feature formed on the wafer based on the wafer design information.

4. The method of claim 2, wherein the first microscope image includes a defect portion and a non-defect portion of the wafer.

5. The method of claim 4, wherein the reference image is obtained based on the non-defect portion of the first microscope image.

6. A system, comprising
    an imaging device configured to obtain a first image of an object at a first resolution;
    a processing unit; and
    a data storage device having executable instructions stored thereon, which when executed by the processing unit, configure the processing unit to implement actions including:
        obtaining the first image;
        identifying a target region on the object based on the first image;
        obtaining a second image of the target region from the first image, the second image having a second resolution that is coarser than the first resolution; and
        generating a third image of the target region based on the second image of the target region through a machine learning process, the third image having a third resolution that is finer than the second resolution.

7. The system of claim 6, wherein the actions further include analyzing the target region in defect classification based on the third image.

8. The system of claim 7, wherein the obtaining the second image of the target region from the first image includes:
    cropping the first image to obtain a cropped portion; and
    enlarging the cropped portion.

9. The system of claim 6, wherein the object is a wafer, and wherein the identifying the target region includes:
    obtaining a reference image of the wafer based on wafer design information of the wafer;
    comparing the first image with the reference image to determine a mismatch between the first image and the reference image on a part of the wafer; and
    identifying the part of the wafer as the target region.

10. The system of claim 9, wherein the wafer design information is retrieved from a first database.

11. The system of claim 9, wherein the actions include retrieving an image of an inspected wafer, and
    wherein the generating the reference image includes learning the reference image based on the retrieved image of the inspected wafer.

12. The system of claim 11, wherein the retrieved image of the inspected wafer includes a non-defect portion of the first image.

13. The system of claim 6, wherein the machine learning process retrieves a feature detail from a database, and wherein the actions further include saving the third image in the database.

14. The system of claim 6, wherein the machine learning process includes:
    partitioning the second image into a plurality of first scale partition parts;
    identifying a first scale feature identifier contained within a first scale partition part of the plurality of first scale partition parts;

mapping the identified first scale feature identifier with a first scale feature detail; and generating a first scale fine image by patching the first scale feature detail onto the first scale partition part.

15. A method, comprising:

receiving a first image of a first image resolution;

identifying a first scale feature contained in the first image;

mapping the identified first scale feature with a first scale feature detail; and generating a second image by patching the first scale feature detail onto the first image.

16. The method of claim 15, wherein the identifying the first scale feature includes:

partitioning the first image into a plurality of first scale partition parts; and identifying an identifier of the first scale feature contained within a first scale partition part of the plurality of first scale partition parts.

17. The method of claim 16, wherein the mapping the identified first scale feature with the first scale feature detail includes using one or more of an intra-scale mutual dependency rule, an inter-scale mutual dependency rule or a circuitry design rule.

18. The method of claim 15, further comprising:

partitioning the second image into a plurality of second scale partition parts;

identifying a second scale feature identifier contained within a second scale partition part of the plurality of second scale partition parts;

mapping the identified second scale feature identifier with a second scale feature detail at least partially based on an intra-scale mutual dependency rule; and generating a third image by patching the second scale feature detail onto the second scale partition part.

19. The method of claim 15, wherein the receiving the first image includes receiving the first image that is obtained from a microscope image of a wafer.

20. The method of claim 15, wherein the first scale feature detail is retrieved from a database.

* * * * *